(12) United States Patent
Neo et al.

(10) Patent No.: US 12,532,559 B2
(45) Date of Patent: Jan. 20, 2026

(54) IMAGE SENSOR PACKAGING STRUCTURES AND RELATED METHODS

(71) Applicant: SEMICONDUCTOR COMPONENTS INDUSTRIES, LLC, Phoenix, AZ (US)

(72) Inventors: Chee Peng Neo, Singapore (SG); Yu-Te Hsieh, Taoyuan (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 585 days.

(21) Appl. No.: 17/664,133

(22) Filed: May 19, 2022

(65) Prior Publication Data
US 2023/0378209 A1  Nov. 23, 2023

(51) Int. Cl.
*H10F 39/00*     (2025.01)
*H01L 23/00*     (2006.01)
*H10F 39/18*     (2025.01)

(52) U.S. Cl.
CPC .......... *H10F 39/806* (2025.01); *H01L 24/29* (2013.01); *H01L 24/32* (2013.01); *H01L 24/73* (2013.01); *H01L 24/83* (2013.01); *H01L 24/92* (2013.01); *H10F 39/024* (2025.01); *H10F 39/804* (2025.01); *H01L 24/05* (2013.01); *H01L 24/27* (2013.01); *H01L 24/45* (2013.01); *H01L 24/48* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/2732* (2013.01); *H01L 2224/29011* (2013.01); *H01L 2224/29013* (2013.01); *H01L 2224/29393* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/48225* (2013.01); *H01L 2224/73215* (2013.01); *H01L 2224/83192* (2013.01); *H01L 2224/83203* (2013.01); *H01L 2224/92165* (2013.01); *H10F 39/18* (2025.01)

(58) Field of Classification Search
CPC ......... H01L 24/29; H01L 24/32; H01L 24/05; H01L 24/45; H01L 24/48; H01L 24/08; H01L 27/14685; H01L 27/14636; H01L 27/14683; H01L 2224/48225
USPC .................................. 257/434, 783
See application file for complete search history.

(56) References Cited

U.S. PATENT DOCUMENTS

| | | | |
|---|---|---|---|
| 2003/0201535 A1* | 10/2003 | Chen | ................ H01L 27/14618 257/784 |
| 2008/0131999 A1 | 6/2008 | Takiar et al. | |
| 2008/0191334 A1 | 8/2008 | Lee et al. | |
| 2010/0105160 A1 | 4/2010 | Singh et al. | |
| 2012/0300304 A1 | 11/2012 | Gollier et al. | |

(Continued)

*Primary Examiner* — Jasmine J Clark
(74) *Attorney, Agent, or Firm* — IPTechLaw

(57) ABSTRACT

Implementations of an image sensor package may include an image sensor die including at least one bond pad thereon; a bond wire wirebonded to the at least one bond pad; and an optically transmissive lid coupled to the image sensor die with an optically opaque film adhesive over the at least one bond pad. The bond wire may extend through the optically opaque film adhesive to the at least one bond pad.

20 Claims, 4 Drawing Sheets

(56) References Cited

U.S. PATENT DOCUMENTS

2013/0234275 A1* 9/2013 Bolken ............... H01L 31/0203
                                                      257/434
2015/0200216 A1   7/2015 Muramatsu et al.
2017/0075127 A1   3/2017 Borrelli et al.
2023/0122384 A1* 4/2023 Shim .................... H10F 39/804
                                                      257/434

* cited by examiner

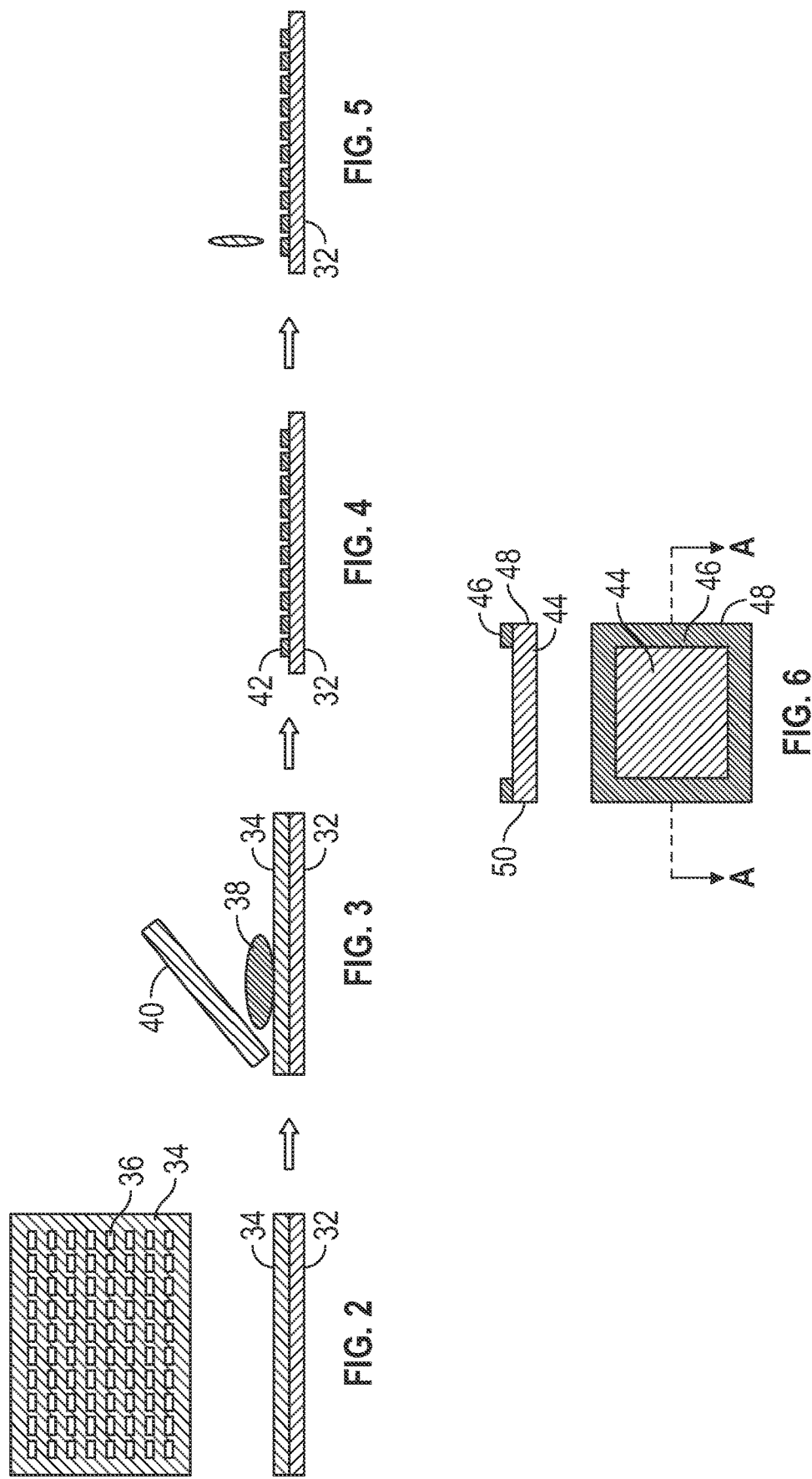

IMAGE SENSOR PACKAGING STRUCTURES AND RELATED METHODS

BACKGROUND

1. Technical Field

Aspects of this document relate generally to image sensor packages, such as devices for detecting electromagnetic radiation.

2. Background

Image sensors are used to detect electromagnetic radiation. Image sensor packages are used to allow the electronic signals from the image sensor to be collected and routed for processing. Many different types of package types for image sensors have been devised.

SUMMARY

Implementations of an image sensor package may include an image sensor die including at least one bond pad thereon; a bond wire wirebonded to the at least one bond pad; and an optically transmissive lid coupled to the image sensor die with an optically opaque film adhesive over the at least one bond pad. The bond wire may extend through the optically opaque film adhesive to the at least one bond pad.

Implementations of image sensor packages may include, one, all, or any of the following:

The package may include a mold compound through which the bond wire extends and which contacts a sidewall of the image sensor die, the optically transmissive lid, and the optically opaque film adhesive.

The package may include a substrate coupled with the image sensor die.

The package may include a ball grid array included in the substrate.

The package may include an air gap between the optically transmissive lid and the image sensor die.

The optically opaque film adhesive may extend across at least a portion of a non-active area of the image sensor die.

Implementations of an image sensor package may include an image sensor die; an optically transmissive lid coupled to the image sensor die through an optically opaque film adhesive contacting at least a portion of a non-active area of the image sensor die; and a bond wire extending through the optically opaque film adhesive.

Implementations of an image sensor package may include one, all, or any of the following:

The package may include a mold compound through which the bond wire extends and which contacts a sidewall of the image sensor die, the optically transmissive lid, and the optically opaque film adhesive.

The package may include a substrate coupled with the image sensor die.

The package may include a ball grid array included in the substrate

The package may include an air gap between the optically transmissive lid and the image sensor die.

The optically opaque film adhesive may extend across at least a portion of a bond pad of the image sensor die.

The bond wire may be wirebonded to the substrate.

Implementations of a method of forming an image sensor package may include wirebonding a bond wire to an image sensor die; bonding an optically transmissive lid to the image sensor die using an optically opaque film adhesive; and passing the bond wire through the optically opaque film adhesive when bonding.

Implementations of a method of forming an image sensor package may include one, all, or any of the following:

The method may include providing an optically transmissive panel; coupling a stencil including a plurality of openings therethrough with a largest planar surface of the optically transmissive panel; applying an optically opaque film adhesive over the plurality of openings in the stencil; removing the stencil; and singulating the optically transmissive panel to form a plurality of optically transmissive lids, each including optically opaque film adhesive thereon.

The method may include where the optically opaque film adhesive may be located around a perimeter of each of the plurality of optically transmissive lids.

The method may include wirebonding the bond wire to a substrate; and coupling the image sensor die to the substrate.

The method may include applying a mold compound through which the bond wire extends where the mold compound contacts a sidewall of the image sensor die, the optically transmissive lid, and the optically opaque film adhesive.

The method may include forming an air gap between the optically transmissive lid and the image sensor die.

The method may include coupling a plurality of solder balls with the substrate to form a ball grid array.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 2 is a side view of an implementation of an optically transmissive panel coupled with a stencil and also showing a top view of the stencil;

FIG. 3 illustrates application of optically opaque film adhesive over the stencil of FIG. 2;

FIG. 4 illustrates the optically transmissive panel following removal of the stencil illustrating a patterned layer of optically opaque film adhesive thereon;

FIG. 5 illustrates the panel of FIG. 4 during a singulation process;

FIG. 6 is a top view and cross sectional view along sectional line A-A of a singulated optically transmissive lid following singulation from the panel of FIG. 5;

DESCRIPTION

This disclosure, its aspects and implementations, are not limited to the specific components, assembly procedures or method elements disclosed herein. Many additional components, assembly procedures and/or method elements known in the art consistent with the intended image sensor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor packages, and implementing components and methods, consistent with the intended operation and methods.

Figure 1:
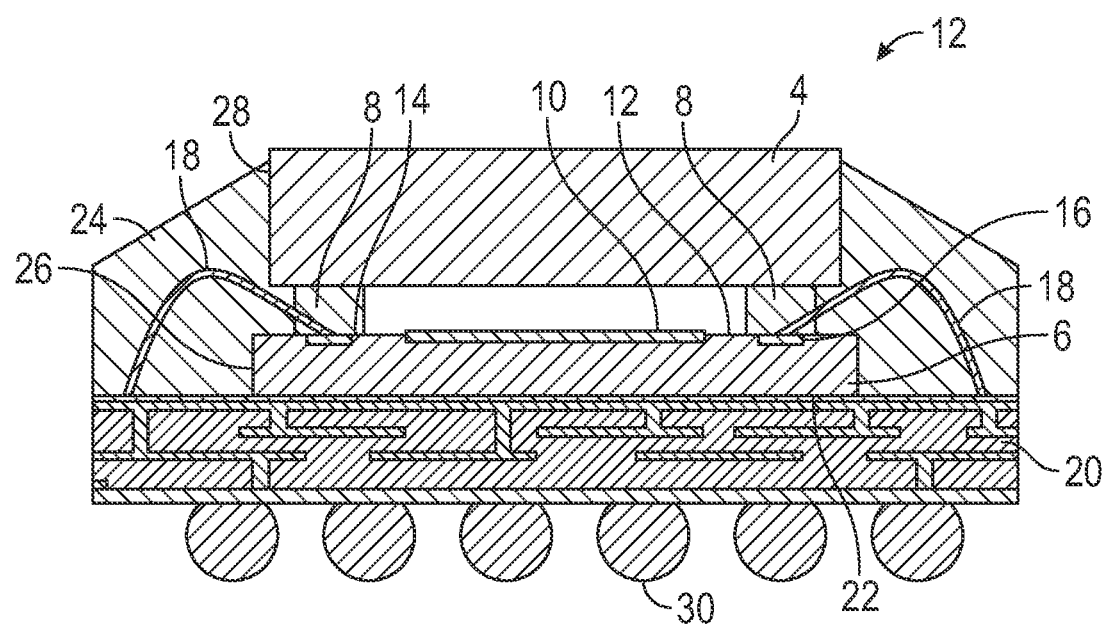
FIG. 1 is a cross sectional view of an implementation of an image sensor package.

Referring to FIG. 1, a cross sectional view of an implementation of an image sensor package 2 like those disclosed herein is illustrated. As illustrated, an optically transmissive lid/cover 4 is coupled to an image sensor die 6 through an optically opaque film adhesive 8. The use of the optically opaque film adhesive serves at least two purposes. First, the optically opaque aspect of the film adhesive works to prevent light/electromagnetic radiation that approaches the image sensor from the side at various angles from encountering the pixel array 10 of the image sensor die 6. Second, because the optically opaque material 8 is an adhesive, it works to bond the optically transmissive lid 4 to a first side 12 of the image sensor die 6. Furthermore, because the optically opaque film adhesive 8 is located at least partially over a non-active area 14 of the image sensor die 6, bond pads 16 may be completely or partially covered by the adhesive. Because of this, no electromagnetic radiation may be able to reflect from the pads, which may reduce issues such as flare from occurring during operation. As used herein, the term "non-active area" of the image sensor die includes the area just outside of the area formed by pixel array 60 out to the outer edge of the pads 58.

As illustrated in FIG. 1, bond wires 18 have been wirebonded to bond pads 16 on the image sensor die 6 and to substrate 20 which is coupled on second side 22 of image sensor die 6. The first side 12 and second side 22 of image sensor die 6 correspond with largest planar sides of the die. As illustrated, each bond wire 18 extends through the material of the optically opaque film adhesive 8, indicating that the wirebonding was completed prior to application of the adhesive. Thus, the material properties of the materials selected for the film adhesive are such as to permit sufficient flow around the wirebonded bond wire to prevent damage to the bond wire and the joint. Also illustrated in FIG. 1 is mold compound/encapsulant 24 which has been applied around the image sensor die 6 and contacts the sidewall 26 of the die. Note that, as illustrated, each bond wire 18 also extends through the mold compound 24. The mold compound 24 also contacts the sidewall 28 of the optically transmissive lid 4 and the material of the optically opaque film adhesive 8. The mold compound may include, by non-limiting example, an epoxy, a resin, a filler, a colorant, a reinforcing material, any combination thereof, or any other component used for a moldable material. Solder balls 30 or other ball/pillar types are also illustrated as being coupled to the substrate 20 allowing the formation of a ball grid array package. While solder balls 30 are illustrated in FIG. 1, other interconnect types may be used including copper pillars or copper studs.

In various implementations, the optically opaque film adhesive is form of a film adhesive to which a pigment has been added. In various implementations, the pigment may be carbon black but, in other implementations, other pigments may be used to enable the film adhesive to be rendered optically opaque to a desired wavelength or range of wavelengths of electromagnetic radiation. In various implementations, the optically opaque film adhesive may be partially cured to form a B-stage adhesive film allowing it to be retained in a sold form but capable of forming full adhesion when thermal compression bonded and fully cured. The use of the optically opaque film may work to reduce glass tilt and eliminate an adhesive paste dispensing portion of a glass attached process thereby improving throughput time. The use of the optically opaque film adhesive also eliminates the need to apply a separate optically opaque mask to the optically transmissive lid prior to applying a glass attached paste that acts as the adhesive between the lid and the image sensor die. In various implementations, the optically transmissive lid may be double-sided antireflective glass. The placement of the optically opaque film adhesive over the bond wires may be referred to a film on wire (FOW) process.

Various methods of forming image sensor packages like those disclosed herein may be utilized to construct the various packages. Referring to FIG. 2, an implementation of an optically transmissive panel 32 is illustrated coupled with stencil 34. As illustrated in FIG. 2, the stencil 34 includes a pattern of openings 36 therethrough. FIG. 3 illustrates a quantity of optically opaque film adhesive 38 being applied with a squeegee 40 into the openings 36 of the stencil 34 (visible in FIG. 2). The openings 36 are located to place the material of the optically opaque film adhesive 38 onto the surface of the optically transmissive panel 32 to form a pattern around the perimeter of each optically transmissive lid. The resulting pattern 42 of optically opaque film adhesive 38 is illustrated in FIG. 4 on a largest planar surface of the optically transmissive panel 32. In some implementations, depending on the particular material of the optically opaque film adhesive, a curing process may be carried out to harden the pattern 42 using, by non-limiting example, heat, ultraviolet light, or a specified period of time. In other implementations, however, no curing process may need to be used. FIG. 5 illustrates the singulating of the various individual optically transmissive lids from the optically transmissive panel 32. In this case, sawing is used though other singulation methods (laser, etching, etc.) could be employed in various implementations. Depending on the particular design of the pattern 42 formed on the optically transmissive panel 32, the singulation process may cut through the material of the pattern 42 during singulation. In other implementations, however, the singulation process may cut only through the material of the panel 32.

FIG. 6 illustrates an implementation of an as-singulated optically transmissive lid 44 with the corresponding optically opaque film adhesive 46 distributed around the perimeter 48 of the lid. FIG. 6 also shows a cross sectional view of the lid 44 along sectional line A-A showing how, in this implementation, the optically opaque film adhesive 46 comes right up to the edge of the perimeter of the optically transmissive lid 44 or comes to the edge of the sidewall 50 of the lid. At this point, the optically transmissive lid 44 is ready for further assembly.

Figure 7:
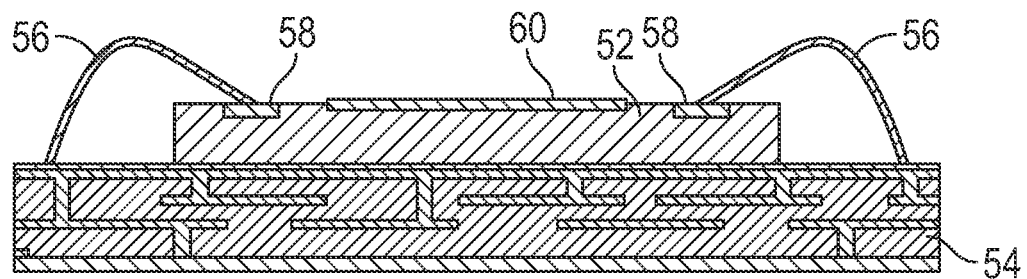
FIG. 7 is a side view of an implementation of an image sensor coupled with a substrate implementations showing two bond wires wirebonded to the image sensor and the substrate.

Referring to FIG. 7, an implementation of a image sensor die 52 is illustrated that has already been coupled with substrate 54 using any of a wide variety of methods of die attach including, by non-limiting example, sintering, die attach film, gluing, bonding, or any other die attach method or system. Following coupling with the substrate 54, bond wires 56 have been wirebonded to pads 58 of the die and to corresponding locations on the substrate 54. The bond wires 56 may be made of any of a wide variety of materials, including, by non-limiting example, gold, aluminum, silver, nickel, aluminum alloys, copper, copper alloys, silver alloys, gold alloys, nickel alloys, or any other bond wire material.

The pads 58 may also be made of a wide variety of materials, including, by non-limiting example, gold, aluminum, silver, nickel, aluminum alloys, copper, copper alloys, nickel alloys, or any other electrically conductive material. The structure of the pads may include one layer or multiple layers of the same or different materials in various implementations. The wirebonding process may be, by non-limiting example, ultrasonic bonding, ball bonding, wedge bonding, compliant bonding, or any other technique for welding or coupling two metallic materials.

Figure 8:
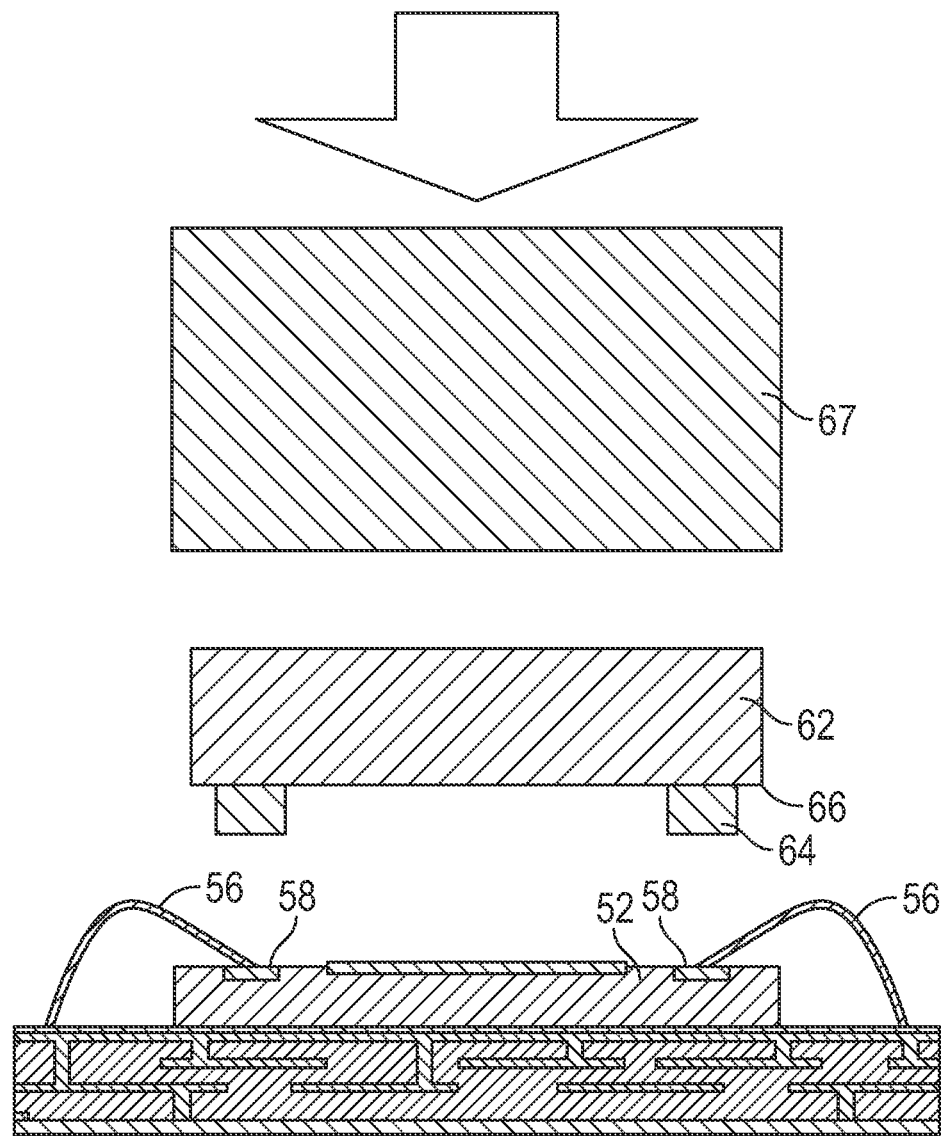
FIG. 8 is a progression view of a process of bonding an optically transmissive lid using optically opaque film adhesive over an image sensor implementation
Figure 9:
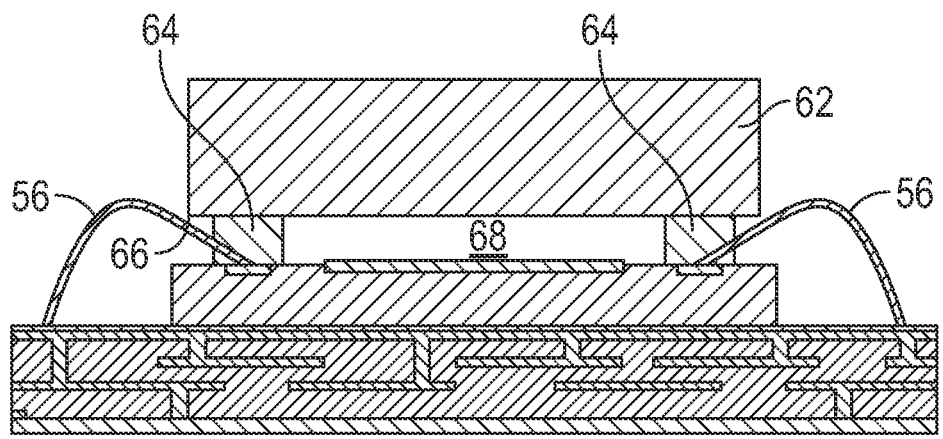
FIG. 9 is a cross sectional view of the image sensor implementation of FIG. 8 following bonding.

Referring to FIG. 8, the image sensor die 52 of FIG. 7 is illustrated during thermal compression bonding with optically transmissive lid 62 that includes optically opaque film adhesive 64 thereon. Note in this implementation that the location of the optically opaque film adhesive 64 is not right at the edge of the sidewall/at the perimeter 66 of the optically transmissive lid 62. During the thermal compression bonding process, thermal compression head 67 presses down on optically transmissive lid 62 while the head and/or bonding chamber heats the assembly. During the bonding, the optically opaque film adhesive 64 contacts the image sensor die 52 and bonds with the surface of the die while flowing around the bond wires 56 to reach the surface of the pads 58 until the film 64 resembles in cross section the arrangement illustrated in FIG. 9. As illustrated in FIG. 9, the bond wires 56 now extend underneath the perimeter 66 (outer shape when viewed from the top, where the optically transmissive lid 62 is square or another closed shape) of the glass lid 62. As visible in FIG. 9, an air gap 68 is now present between the image sensor die 52 and the optically transmissive lid 62 as the optically opaque film adhesive 64 forms a dam that seals the active area of the image sensor die 52.

While in the implementation illustrated in FIG. 9 an air gap 68 is present after bonding, in other image sensor implementations, no air gap may be included as another optically transmissive material with a defined index of refraction may be placed into the dam formed by the optically opaque film adhesive prior to the thermal compression bonding. In other implementations, an optically transmissive material with a defined index of refraction may be formed previously over the active area of the image sensor die at a predetermined height. The optically opaque film adhesive then is placed over the image sensor die around the optically transmissive material forming a structure that substantially lacks an air gap (depending on the tolerance between the optically opaque film adhesive and the optically transmissive material).

Figure 10:
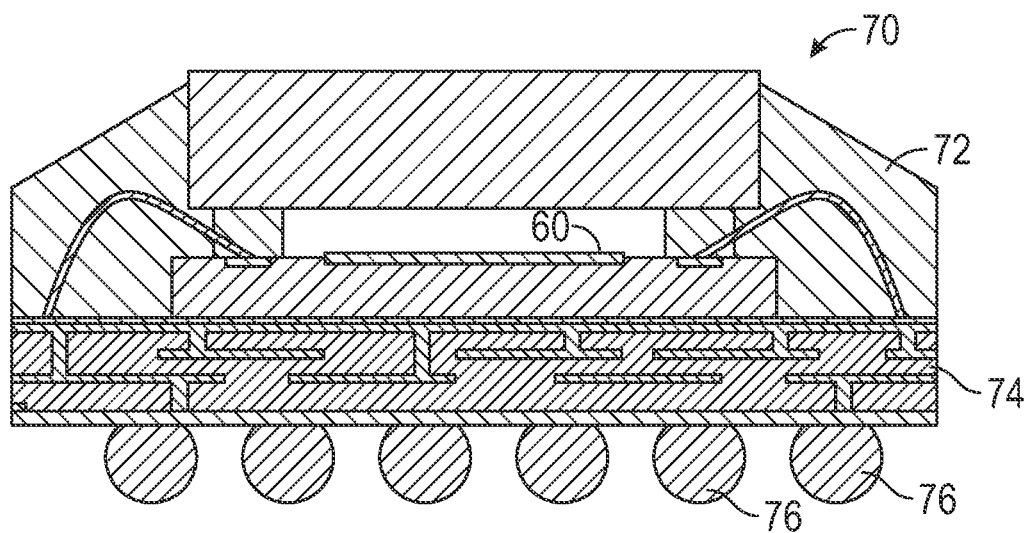
FIG. 10 is a cross sectional view of the package implementation of FIG. 9 following application of a mold compound.

Referring to FIG. 10, the finished package 70 is illustrated following application of mold compound 72. The mold compound may be applied using any of a wide variety of molding techniques, including, by non-limiting example, transfer molding, compression molding, injection molding, or any other method of applying a flowable mold compound to the package and retaining it to a solid state. FIG. 10 also illustrates the substrate 74 following the ball attach/ball mounting process which adds the solder balls 76 to the desired locations to the substrate. As previously mentioned, however, no ball attach process may be employed in particular implementations as other electrical connection techniques may be employed in various implementations. For example, where the substrate is to be bonded to a circuit board/motherboard using pads only, no additional electrical connections may be added. In others, copper pillar or stud forming/attach processes may be employed to form the electrical connections with the substrate either prior to or after assembly of the image sensor package.

While the use of substrates has been disclosed in the package and method implementations disclosed in this document, substrates may not be used in various implementations. In such implementations, a leadframe may be employed to form the interconnects. Where leadframes are not used, by way of non-limiting example, where the image sensor die is bonded directly to a circuit board/motherboard, the method implementations disclosed herein still allow for bonding of the optically transmissive lid to the image sensor die via the optically opaque film adhesive. Also, in other implementations, where the image sensor die is a flip chip die or otherwise has electrical connections routed to the surface of the die opposing the active area (via through-silicon-vias or other routing structures), the image sensor die may already be configured to be coupled with a circuit board or motherboard independent of additional routing provided by a substrate.

While the use of a single image sensor die has been illustrated in the structure and method implementations disclosed in this document, the image sensor die may actually include two or more die bonded together within the perimeter of the die. By non-limiting example, the die may include an image sensor die bonded to a signal processing die using hybrid or fusion bonding following a previous wafer-level or die-level process. In some implementations, however, the bonding may not be carried out using hybrid or fusion processes, but the die may be stacked through coupling using die attach film, electrical connections, or other die-to-die bonding techniques. In some implementations, as when the image sensor die is a backside illuminated (BSI) image sensor, while the active area has been shown as being on the surface of the image sensor die that faces the optically transmissive lid, the actual electromagnetic radiation sensing portions of the image sensor may actually be located within the material of the image sensor die. Thus, the indication of the pixel array 60 as being on the surface of the image sensor die is for the purposes of convenient illustration only and not meant to show the actual physical location of the pixels in every possible image sensor type that could be used in various package implementations.

Those of ordinary skill in the art will be able to readily construct numerous combinations of image sensor packages that include any of a wide variety of image sensor types, substrate types (or not), and optically transmissive lids using the principles disclosed herein. In each of these, the ability of the optically opaque adhesive film to both bond the optically transmissive lid to the image sensor die while eliminating/substantially reducing the ability of electromagnetic radiation not directly incident on the lid from reaching the pixel array of the image sensor die may provide anti-flare protection and improved performance in each of these various image sensor package variations.

In places where the description above refers to particular implementations of image sensor packages and implementing components, sub-components, methods and sub-methods, it should be readily apparent that a number of modifications may be made without departing from the spirit thereof and that these implementations, implementing components, sub-components, methods and sub-methods may be applied to other image sensor packages.

What is claimed is:
1. An image sensor package comprising:
an image sensor die comprising at least one bond pad thereon;
a bond wire wirebonded to the at least one bond pad; and an optically transmissive lid coupled to the image sensor die with an optically opaque film adhesive over the at least one bond pad;

wherein the bond wire extends through the optically opaque film adhesive to the at least one bond pad.

2. The package of claim 1, further comprising a mold compound through which the bond wire extends and which contacts a sidewall of the image sensor die, the optically transmissive lid, and the optically opaque film adhesive.

3. The package of claim 1, further comprising a substrate coupled with the image sensor die.

4. The package of claim 3, further comprising a ball grid array underneath the substrate.

5. The package of claim 1, further comprising an air gap between the optically transmissive lid and the image sensor die.

6. The package of claim 1, wherein the optically opaque film adhesive extends across at least a portion of a non-active area of the image sensor die.

7. The package of claim 1, wherein the optically opaque film adhesive's opacity is achieved through the addition of a carbon black pigment.

8. An image sensor package comprising:
an image sensor die;
an optically transmissive lid coupled to the image sensor die through an optically opaque film adhesive contacting at least a portion of a non-active area of the image sensor die; and
a bond wire extending through the optically opaque film adhesive.

9. The package of claim 8, further comprising a mold compound through which the bond wire extends and which contacts a sidewall of the image sensor die, the optically transmissive lid, and the optically opaque film adhesive.

10. The package of claim 8, further comprising a substrate coupled with the image sensor die.

11. The package of claim 10, further comprising a ball grid array underneath the substrate.

12. The package of claim 8, further comprising an air gap between the optically transmissive lid and the image sensor die.

13. The package of claim 8, wherein the optically opaque film adhesive extends across at least a portion of a bond pad of the image sensor die.

14. The package of claim 10, wherein the bond wire is wirebonded to the substrate.

15. The package of claim 8, wherein the optically opaque film adhesive's opacity is achieved through the addition of a carbon black pigment.

16. An image sensor package comprising:
an image sensor die comprising at least one bond pad thereon;
a bond wire wirebonded to the at least one bond pad;
an optically transmissive lid coupled to the image sensor die with an optically opaque film adhesive over the at least one bond pad;
a mold compound coupled to the image sensor die, wherein the mold compound extends to an outermost sidewall of the package;
wherein the bond wire extends through the optically opaque film adhesive to the at least one bond pad;
wherein the bond wire extends through the mold compound; and
wherein the mold compound contacts a sidewall of the image sensor die, the optically transmissive lid, and the optically opaque film adhesive.

17. The package of claim 16, further comprising a substrate coupled with the image sensor die.

18. The package of claim 17, wherein an outermost perimeter of the mold compound and the substrate are equal.

19. The package of claim 16, further comprising a ball grid array underneath the substrate.

20. The package of claim 16, further comprising an air gap between the optically transmissive lid and the image sensor die.

* * * * *